United States Patent
Inazuki et al.

(10) Patent No.: US 11,143,949 B2
(45) Date of Patent: Oct. 12, 2021

(54) PHOTOMASK BLANK, METHOD OF MANUFACTURING PHOTOMASK, AND PHOTOMASK

(71) Applicant: Shin-Etsu Chemical Co., Ltd., Tokyo (JP)

(72) Inventors: Yukio Inazuki, Joetsu (JP); Kouhei Sasamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 142 days.

(21) Appl. No.: 16/419,132

(22) Filed: May 22, 2019

(65) Prior Publication Data
US 2019/0369482 A1 Dec. 5, 2019

(30) Foreign Application Priority Data
May 31, 2018 (JP) .............................. JP2018-104532

(51) Int. Cl.
*G03F 1/26* (2012.01)
*G03F 1/80* (2012.01)
(Continued)

(52) U.S. Cl.
CPC .................. *G03F 1/24* (2013.01); *G03F 1/26* (2013.01); *G03F 1/80* (2013.01); *H01L 21/0332* (2013.01);
(Continued)

(58) Field of Classification Search
CPC ..... G03F 1/24; G03F 1/26; G03F 1/32; G03F 1/52; G03F 1/54; G03F 1/22; G03F 1/29; G03F 1/30
See application file for complete search history.

(56) References Cited

U.S. PATENT DOCUMENTS 8,940,462 B2   1/2015 Hashimoto et al.
2006/0099517 A1* 5/2006 Sugawara ............. B82Y 10/00
                                                              430/5
(Continued)

FOREIGN PATENT DOCUMENTS

JP    2007-183591 A    7/2007
JP    2007-241060 A    9/2007
(Continued)

*Primary Examiner* — John A McPherson
*Assistant Examiner* — Nicholas E Brown
(74) *Attorney, Agent, or Firm* — Birch, Stewart, Kolasch & Birch, LLP

(57) ABSTRACT

Provided is a photomask blank including, on a substrate, a processing film and a film made of a material containing chromium which is formed to be in contact with the processing film and has a three-layer structure of first, second and third layers, each of which contains chromium, oxygen, and nitrogen, wherein the first layer has a chromium content of 40 atomic % or less, an oxygen content of 50 atomic % or more, a nitrogen content of 10 atomic % or less, and a thickness of 20 nm or more, the second layer has a chromium content of 50 atomic % or more, an oxygen content of 20 atomic % or less, and a nitrogen content of 30 atomic % or more, and the third layer has a chromium content of 40 atomic % or less, an oxygen content of 50 atomic % or more, and a nitrogen content of 10 atomic % or less.

14 Claims, 8 Drawing Sheets

(51) Int. Cl.
*H01L 21/033* (2006.01)
*H01L 21/308* (2006.01)
*G03F 1/24* (2012.01)

(52) U.S. Cl.
CPC ...... *H01L 21/0337* (2013.01); *H01L 21/0338* (2013.01); *H01L 21/3081* (2013.01); *H01L 21/3086* (2013.01); *H01L 21/3088* (2013.01)

(56) References Cited

U.S. PATENT DOCUMENTS

| | | | |
|---|---|---|---|
| 2007/0212619 A1 | 9/2007 | Yoshikawa et al. | |
| 2011/0111332 A1* | 5/2011 | Iwashita | G03F 1/58 |
| | | | 430/5 |
| 2013/0196255 A1* | 8/2013 | Hayashi | G03F 1/24 |
| | | | 430/5 |
| 2015/0338731 A1* | 11/2015 | Nozawa | G03F 1/32 |
| | | | 430/5 |
| 2017/0068156 A1 | 3/2017 | Sasamoto | |
| 2017/0263444 A1* | 9/2017 | Shoki | G03F 1/80 |

FOREIGN PATENT DOCUMENTS

| | | | |
|---|---|---|---|
| JP | 2014-197215 A | | 10/2014 |
| JP | 2016071280 A | * | 5/2016 |
| JP | 2017-49475 A | | 3/2017 |

* cited by examiner

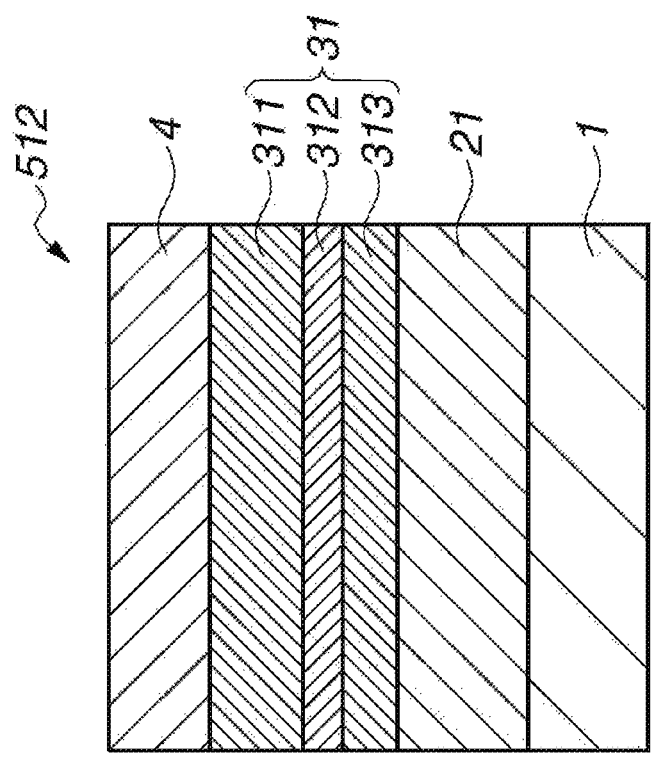

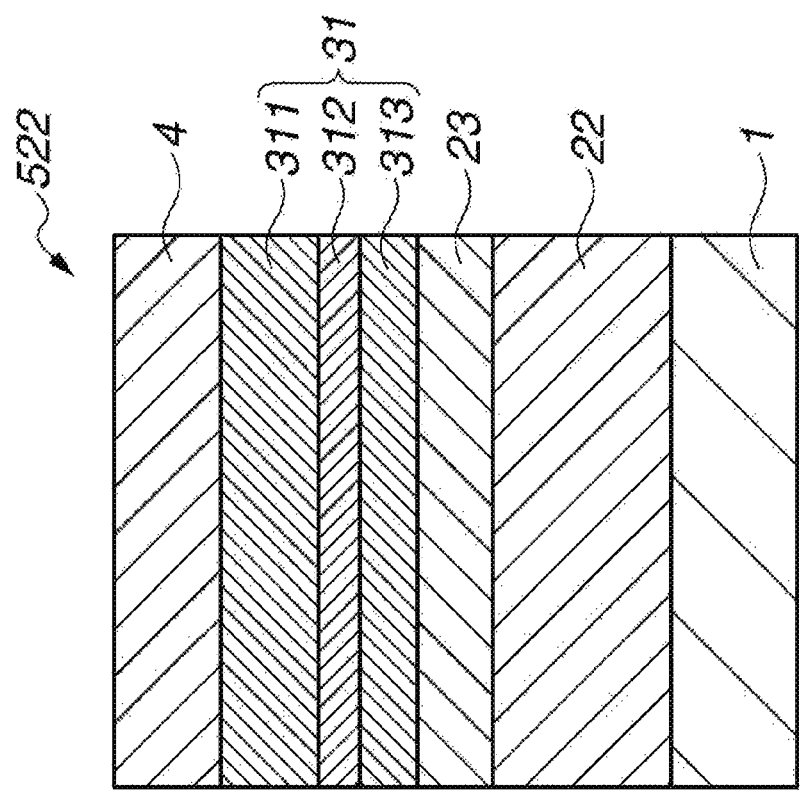

PHOTOMASK BLANK, METHOD OF MANUFACTURING PHOTOMASK, AND PHOTOMASK

CROSS-REFERENCE TO RELATED APPLICATION

This non-provisional application claims priority under 35 U.S.C. § 119(a) on Patent Application No. 2018-104532 filed in Japan on May 31, 2018, the entire contents of which are hereby incorporated by reference.

TECHNICAL FIELD

The present invention relates to a photomask blank used in manufacturing a semiconductor device or the like, a method of manufacturing a photomask using the same, and a photomask.

BACKGROUND ART

In recent years, with the miniaturization of semiconductor devices, particularly, due to high integration of large scale integrated circuits, high pattern resolution is required for projection exposure. Therefore, as a technique for improving resolution of a transferred pattern in a photomask, a phase shift mask has been developed. The principle of the phase shift method is that the phase of transmitted light passing through the opening of the photomask is adjusted so as to be inverted by about 180 degrees with respect to the phase of the transmitted light passing through the portion adjacent to the opening, and thus, the light intensity at the boundary portion is weakened when the transmitted light beams interfere with each other, so that the resolution and the depth of focus of the transferred pattern are improved. The photomask using this principle is generally called a phase shift mask.

In the most common structure of the phase shift mask blank used for the phase shift mask, a phase shift film is stacked on a transparent substrate such as a glass substrate, and a film containing chromium (Cr) is stacked on the phase shift film. Generally, in most cases, the phase shift film is formed as a film containing molybdenum (Mo) and silicon (Si) with a phase shift of 175 to 185 degrees and a transmittance of about 6 to 30% with respect to exposure light. In addition, generally, the film containing chromium is adjusted to have a thickness such that a desired optical density is obtained together with the phase shift film, and the film containing chromium is used as a light shielding film and a hard mask film for etching the phase shift film.

More specifically, as a method of forming the pattern of the phase shift mask from the phase shift mask blank, a resist film is formed on a film containing chromium of a phase shift mask blank, a resist pattern is formed by drawing and developing a pattern on the resist film by light or electron beams, and a pattern is formed by etching the film containing chromium by using the resist pattern as an etching mask. Furthermore, the phase shift film is etched by using the pattern of the film containing chromium as an etching mask to form a phase shift film pattern, and then the resist pattern and the pattern of the film containing chromium are removed.

Herein, the light shielding film is allowed to remain outside the portion where the circuit pattern of the phase shift film pattern is formed to be used as a light shielding portion (light shielding film pattern) at the outer peripheral portion so that the optical density of a combination of the phase shift film and the light shielding film becomes 3 or more. This is because unnecessary exposure light is leaked and irradiated on the resist film on an adjacent chip located outside the circuit pattern when the circuit pattern is transferred to a wafer by using a wafer exposure apparatus. As a method for forming such a light shielding film pattern, there is a general method of forming a phase shift film pattern, removing a resist pattern, newly forming a resist film, and etching a film containing chromium by using a resist pattern formed by pattern drawing and development as an etching mask, to form the light shielding film pattern at the outer peripheral portion.

In a phase shift mask requiring high-precision pattern formation, dry etching using gas plasma is the mainstream for etching. As the dry etching of a film containing chromium, dry etching (chlorine-based dry etching) using a chlorine-based gas containing oxygen is used; and as the dry etching of a film containing molybdenum and silicon, dry etching (fluorine-based dry etching) using a fluorine-based gas is used.

Along with the miniaturization of the circuit pattern, a technique for finely forming the phase shift mask pattern is also required. In particular, the assist pattern of the line pattern that assists the resolution of the main pattern of the phase shift mask needs to be formed to be smaller than the main pattern so as not to be transferred to the wafer when transferring the circuit pattern to the wafer by using the wafer exposure apparatus. In the phase shift mask of the generation having the minimum line width of the circuit on the wafer of 7 nm, the line width of the assist pattern of the line pattern on the phase shift mask is required to be about 40 nm.

A chemically amplified resist for forming a fine pattern is made of a base resin, an acid generator, a surfactant, and the like, and since many reactions in which an acid generated by exposure acts as a catalyst can be applied, a high sensitivity can be obtained, and a mask pattern such as a fine phase shift mask pattern having a line width of 0.2 μm or less can be formed by using the chemically amplified resist. However, as the pattern width of the chemically amplified resist decreases, the fine pattern collapses due to the collision of the developing solution in the developing process, and thus, the resolution limit is reached.

For example, in the method described in JP-A 2014-197215 (Patent Document 1), in order to form a fine assist pattern, the collapse of the fine pattern in the developing process is reduced by thinning the resist film, and in this method, carbon is added to a film containing chromium which is an etching mask film to form a film having a high etching rate. In the etching using a resist film, the resist film is also etched at the same time during the etching of the film containing chromium, and in a case where the resist film is lost during the etching of the film containing chromium, pinholes are generated in the surface layer of the film containing chromium, and thus, a sufficient amount of the resist film needs to remain after the etching of the film containing chromium. However, in the method described in JP-A 2014-197215, since the etching rate of the film containing chromium is high, the etching of the film containing chromium is ended relatively early, so that the resist film can be thinned.

With miniaturization of the transfer pattern, minute defects on the photomask such as a phase shift mask affect the transfer of the circuit pattern to the wafer during exposure. The minute defects include protrusion defects adjacent to the photomask pattern such as a phase shift film pattern and dot defects isolated and generated on the transparent substrate. In the photomask, if there is a portion different from the desired pattern even in one place in the circuit pattern, this portion may become a critical defect, and an electronic device that operates correctly cannot be manufactured from such a photomask.

For this reason, a defect of a photomask such as a phase shift mask is detected by an appearance inspection apparatus after manufacturing the photomask by forming a photomask pattern such as a phase shift film pattern, and the detected defect is removed by a defect correction apparatus. As the defect correction method, there are mechanical methods, laser methods, ion beam methods, electron beam methods, and the like. The electron beam method with high correction accuracy is generally used for minute defects of 100 nm or less. With respect to the correction by the electron beam method, for example, in a case of defects in the pattern of the phase shift film, it takes about 10 to 20 minutes per defect, and with respect to the wafer transfer simulation for conforming that the correction site does not influence the wafer transfer, it takes about 20 to 50 minutes per correction site. For this reason, in order to reduce the time required for manufacturing a photomask such as a phase shift mask, the smaller the total number of defects on the photomask, the more advantageous.

In many cases, the defects generated in the photomask pattern such as the phase shift film pattern are generated during the processes of manufacturing the photomask such as the developing process, the dry etching process, or the cleaning process. However, during manufacturing the photomask blank such as the phase shift mask blank, defects are generated. Since the defect of the photomask blank also becomes a defect of the photomask such as the phase shift mask, the defect inspection is generally performed on the photomask blank by a laser inspection apparatus. Nevertheless, a photomask blank with a small number of defects needs to be used in order to reduce the total number of defects in the photomask and to reduce the time required for manufacturing a photomask such as a phase shift mask by reducing the time required for defect correction of the photomask and wafer transfer simulation.

CITATION LIST

Patent Document 1: JP-A 2014-197215

SUMMARY OF THE INVENTION

As the defects of the photomask, besides the above-described defects, defects caused by the resist film also cause problems. In a case of a photomask blank where a film containing silicon and a film containing chromium are sequentially formed on a substrate such as a transparent substrate, when a resist film is formed by applying resist on the film containing chromium, in a case where particles are generated on the surface of the resist film or in the resist film, defects of the photomask are increased. For this reason, generally, the formed resist film is removed and cleaned, and a resist film is formed by applying resist again.

In the removing and cleaning of the resist film, generally, a mixed solution of sulfuric acid and hydrogen peroxide water (sulfuric acid/hydrogen peroxide, SPM). In this case, after removing the resist film by using a mixed solution of sulfuric acid and hydrogen peroxide water, the surface of the film containing chromium is acidic, and is rinsed for neutralization by using ammonia added water (ammonia added peroxide hydrogen water (APM)) which is alkaline. However, generally, sulfuric acid cannot be completely removed from the surface of the film containing chromium, and sulfate ions remain on the surface of the film containing chromium. In a case where sulfate ions remain on the surface of the film containing chromium, adhesion to the resist film to be formed thereafter is deteriorated, the line pattern is likely to collapse due to impact by the developing solution during development and impact by the rinse solution in the rinsing process, and as a result, there is a concern that that resolution of the line pattern is deteriorated. For this reason, it is required that the film containing chromium has good adhesion to the resist film, and the adhesion is not deteriorated even in a case where removing the resist film by using the above-mentioned mixed solution of sulfuric acid and hydrogen peroxide water.

For example, according to the method described in the above-mentioned JP-A 2014-197215 (Patent Document 1), the thickness of the film containing chromium can be formed as thin as 20 nm or less, and thus, the resist film can be thinned. However, in this case, since the film containing chromium is thin, and particularly, the oxygen in the surface layer portion of the film containing chromium is insufficient, when a resist is applied on the film containing chromium, it was found that, oxygen in the film containing chromium which contributes to the adhesion to the resist film is not sufficiently supplied to the interface between the film containing chromium and the resist film, and sufficient assist pattern resolution cannot be obtained. In addition, since the film containing chromium contains carbon, in a case where the removing the resist film is performed by using the mixed solution of sulfuric acid and hydrogen peroxide water as described above, the film containing carbon is easy to chemically react as compared with a film being free of carbon, and sulfate ions are easy to remain on the surface of the film containing chromium and carbon. Therefore, it was found that when a resist film is formed again by applying a resist, adhesion of the resist film to the film containing chromium is deteriorated, and sufficient assist pattern resolution cannot be obtained.

The present invention has been made to solve the above problems, and an object of the present invention is to provide a photomask blank having high adhesion of a resist film to a film containing chromium, obtaining the adhesion of the resist film to the film containing chromium not to be deteriorated even if removing the resist film formed on the film containing chromium by using a mixed solution of sulfuric acid and hydrogen peroxide water and forming a resist film again, and capable of achieving a good resolution limit in forming an assist pattern of a line pattern which assists the resolution of a main pattern of a photomask such as a phase shift mask, a method of manufacturing a photomask by using the photomask blank, and a photomask.

In order to solve the above-mentioned problems, the inventors of the present invention has intensively studied a photomask blank including a substrate such as a transparent substrate, a film made of a material containing chromium, and a processing film which is formed to be in contact with a side of a film made of a material containing chromium close to the substrate and is to be processed by using a pattern of the film made of the material containing chromium as an etching mask. As a result, it has been found that adhesion of a resist film to the film containing chromium is good in an oxygen-rich film containing oxygen and nitrogen and that in such an oxygen-rich film containing oxygen and nitrogen, sulfate ions are hard to remain on a surface when removing the resist film by using a mixed solution of sulfuric acid and hydrogen peroxide water. Therefore, it is found that it is effective that the film made of the material containing chromium is a stacked film having a three-layer structure including a first layer, a second layer and a third layer from a side apart from the substrate, each of the first layer, the second layer and the third layer contains chromium, oxygen and nitrogen, the composition of the first layer has a chromium content of 40 atomic % or less, an oxygen content of 50 atomic % or more, and a nitrogen content of 10 atomic % or less, the composition of the second layer has a chromium content of 50 atomic % or more, an oxygen content of 20 atomic % or less, a nitrogen content of 30 atomic % or more, the composition of the third layer has a chromium content of 40 atomic % or less, an oxygen content of 50 atomic % or more, and a nitrogen content of 10 atomic % or less, and the thickness of the first layer is 20 nm or more.

Then, it is found that, in such a photomask blank, for example, a phase shift mask blank in which a phase shift film which is a film made of a material containing silicon is formed as a processing film or a reflective mask blank in which an absorption film as a film made of a material containing tantalum is formed, adhesion of a resist film to the film containing chromium is high, and the adhesion of the resist film to the film containing chromium is not deteriorated even in removing the resist film formed on the film containing chromium by using a mixed solution of sulfuric acid and hydrogen peroxide water and forming a resist film again, even in a case where a photomask is manufactured by a general method of manufacturing the photomask, in forming an assist pattern of a line pattern which assists resolution of a main pattern of the photomask, a good resolution limit can be achieved.

In one aspect, the invention provides a photomask blank including: a substrate; a film made of a material containing chromium; and a processing film which is formed to be in contact with a side of the film made of the material containing chromium close to the substrate and is processed by using a pattern of the film made of the material containing chromium as an etching mask, wherein the film made of the material containing chromium is a stacked film having a three-layer structure including a first layer, a second layer and a third layer from a side apart from the substrate, and each of the first layer, the second layer and the third layer contains chromium, oxygen and nitrogen, the first layer has a chromium content of 40 atomic % or less, an oxygen content of 50 atomic % or more, a nitrogen content of 10 atomic % or less, and a thickness of 20 nm or more, the second layer has a chromium content of 50 atomic % or more, an oxygen content of 20 atomic % or less, and a nitrogen content of 30 atomic % or more, and the third layer has a chromium content of 40 atomic % or less, an oxygen content of 50 atomic % or more, and a nitrogen content of 10 atomic % or less.

In a preferred embodiment, the second layer has a thickness of 5 nm or less, and the third layer has a thickness of 5 nm or more.

In a preferred embodiment, the processing film is a film made of a material containing silicon.

In a preferred embodiment, the film made of the material containing chromium is a light shielding film, the film made of the material containing the silicon is a phase shift film, the photomask blank is a phase shift mask blank, and an optical density of a combination of the light shielding film and the phase shift film is 3 or more with respect to exposure light.

Preferably, the film made of the material containing chromium has a thickness of 40 nm or more and 65 nm or less.

Also preferably, the phase shift film has a phase shift of 175 degrees or more and 185 degrees or less and a transmittance of 6% or more and 30% or less, with respect to the exposure light, and a thickness of 50 nm or more and 90 nm or less.

In a preferred embodiment, the processing film is a film made of a material containing tantalum.

Preferably, the film made of the material containing the tantalum is an absorption film for light in an extreme ultraviolet region, the photomask blank is a reflective mask blank having a reflection film for light in an extreme ultraviolet region, and the reflection film is formed to be in contact with a side of the absorption film close to the substrate.

In a preferred embodiment, the photomask blank further includes a resist film which is in contact with a side of the film made of the material containing chromium apart from the substrate and has a thickness of 50 nm or more and 200 nm or less.

In another aspect, the invention provides a method of manufacturing a photomask having a circuit pattern of the film made of the material containing silicon from the photomask blank according to 3, including steps of:

(A) forming a resist film in contact with a side of the film made of the material containing chromium apart from the substrate;

(C) patterning the resist film to form a resist pattern;

(D) patterning the film made of the material containing chromium by dry etching using a chlorine-based gas containing oxygen by using the resist pattern as an etching mask to form a pattern of the film made of the material containing chromium;

(E) patterning the film made of the material containing silicon by dry etching using a fluorine-based gas by using the pattern of the film made of the material containing chromium as an etching mask to form a pattern of the film made of the material containing silicon; and (F) after the step (E), allowing the film made of the material containing chromium to remain in a portion located on an outer peripheral portion of the substrate which is a region where a circuit pattern of the film made of the material containing the silicon is not formed and removing a pattern of the film made of the material containing chromium other than the outer peripheral portion by dry etching using a chlorine-based gas containing oxygen.

In a preferred embodiment, the method further includes, between the steps (A) and (C), a step of (B) removing the resist film by using a mixed solution of sulfuric acid and hydrogen peroxide water to newly form a resist film to be brought into contact with a side of the film made of the material containing chromium apart from the substrate.

In a still further aspect, the invention provides a photomask having a circuit pattern of a film made of a material containing silicon on a substrate, wherein a film made of a material containing chromium is formed to be in contact with the film made of the material containing the silicon in a portion located on an outer peripheral portion of the substrate which is a region where a circuit pattern of the film made of the material containing the silicon is not formed, the film made of the material containing chromium is a stacked film having a three-layer structure including a first layer, a second layer and a third layer from a side apart from the substrate, and each of the first layer, the second layer and the third layer contains chromium, oxygen and nitrogen, the first layer has a chromium content of 40 atomic % or less, an oxygen content of 50 atomic % or more, a nitrogen content of 10 atomic % or less, and a thickness of 20 nm or more, the second layer has a chromium content of 50 atomic % or more, an oxygen content of 20 atomic % or less, and a nitrogen content of 30 atomic % or more, and the third layer has a chromium content of 40 atomic % or less, an oxygen content of 50 atomic % or more, and a nitrogen content of 10 atomic % or less.

In a preferred embodiment, the second layer has a thickness of 5 nm or less, and the third layer has a thickness of 5 nm or more.

In a preferred embodiment, the film made of the material containing chromium is a light shielding film, the film made of the material containing the silicon is a phase shift film, the photomask is a phase shift mask, and an optical density of a combination of the light shielding film and the phase shift film is 3 or more, with respect to exposure light.

Preferably, the film made of the material containing chromium has a thickness of 40 nm or more and 65 nm or less.

Also preferably, the phase shift film has a phase shift of 175 degrees or more and 185 degrees or less and a transmittance of 6% or more and 30% or less, with respect to the exposure light, and a thickness of 50 nm or more and 90 nm or less.

Advantageous Effects of the Invention

According to the photomask blank according to the present invention, high adhesion of the resist film to the film containing chromium can be obtained, even in a case of manufacturing the photomask by a general method of manufacturing the photomask without using a special development process or a special dry etching process, collapse of a fine line pattern due to collision of a developing solution or the like in the developing process is suppressed, and in forming an assist pattern of the line pattern that assists resolution of a main pattern of the photomask, a good resolution limit can be achieved. Furthermore, even if the resist film formed on the film containing chromium is removing by using a mixed solution of sulfuric acid and hydrogen peroxide water to form a resist film again, adhesion of the resist film to the film containing chromium is not deteriorated. For this reason, even if the resist film is formed again by re-coating the resist in order to avoid defects in the photomask due to the particles derived from a prior resist film formed by coating the resist, similarly, a good resolution limit can be achieved.

BRIEF DESCRIPTION OF THE DRAWINGS

FIG. 5 is a cross-sectional view illustrating another example of a first embodiment (phase shift mask blank) of the photomask blank according to the present invention.

FIG. 6 is a cross-sectional view illustrating another example of a second embodiment (reflective mask blank) of the photomask blank according to the present invention.

DESCRIPTION OF THE PREFERRED EMBODIMENT

Figure 1:
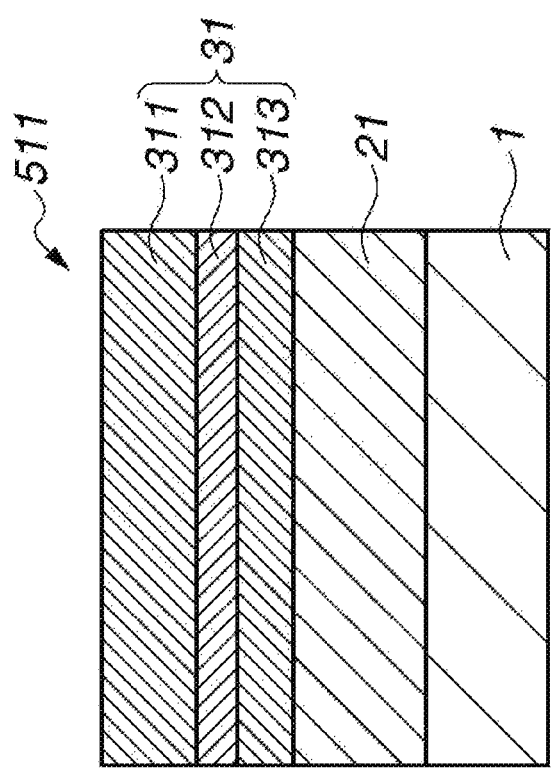
FIG. 1 is a cross-sectional view illustrating an example of a first embodiment (phase shift mask blank) of a photomask blank according to the present invention.

A photomask blank according to the present invention includes a substrate, a film made of a material containing chromium, and a processing film which is formed to be in contact with a side of the film made of the material containing chromium close to the substrate and is processed by using a pattern of the film made of the material containing chromium as an etching mask. That is, the photomask blank according to the present invention includes, on a substrate, the processing film and the film made of the material containing chromium from the side close to the substrate. The film made of the material containing chromium is formed to be in contact with the processing film. In the present invention, the film made of the material containing chromium is a stacked film having a three-layer structure including a first layer, a second layer and a third layer from the side apart from the substrate.

A photomask having a circuit pattern of a processing film such as a film made of a material containing silicon or a film made of a material containing tantalum, on the substrate can be manufactured from the photomask blank according to the present invention. Particularly, a photomask in which the film made of the material containing chromium is formed to be in contact with the film made the material containing silicon in a portion located on an outer peripheral portion of the substrate which is a region (that is, out of a region (effective region) where the circuit pattern is formed) where a circuit pattern of the film made of the material containing silicon on the photomask is not formed can be manufactured from the photomask blank.

As the substrate, there are no particular limitations on the type of the substrate and the size of the substrate, and in a reflective photomask blank and a reflective photomask do not necessarily need to be transparent at the wavelength used as an exposure wavelength. However, particularly, in a transmissive photomask blanks and a transmissive photomask, a transparent substrate such as a quartz substrate which is transparent at a wavelength used as an exposure wavelength is applied, and for example, a 6025 substrate having a size of 6 inch square and a thickness of 0.25 inch which is prescribed in the SEMI standard is preferable. In a case where the SI unit system is used, the 6025 substrate is generally represented as a substrate having a size of 152 mm square and a thickness of 6.35 mm. In a case where the processing film is a film made of a material containing silicon, as the film made of the material containing silicon, a light shielding film, an antireflection film, and an optical film of a phase shift film such as a half tone phase shift film are preferable for using in a transmissive photomask.

In a case where the film made of the material containing silicon is a phase shift film (for example, a halftone phase shift film), the photomask blank is a phase shift mask blank (halftone phase shift mask blank), and a phase shift mask (for example, a halftone phase shift mask) is manufactured from the phase shift mask blank.

A phase shift mask having a phase shift film pattern including a circuit pattern (photomask pattern) on a transparent substrate can be manufactured from the phase shift mask blank. In addition, a phase shift mask where the film made of the material containing chromium is formed to be in contact with the phase shift film in a portion located on an outer peripheral portion of the transparent substrate which is a region where a circuit pattern of the phase shift film on the phase shift mask is not formed may be manufactured from the phase shift mask blank. It is preferable that the film made of the material containing chromium is a light shielding film, and when the phase shift mask is manufactured from the phase shift mask blank, a film of a hard mask film used as an etching mask in etching of the phase shift film may be allowed to remain to form the light shielding film.

The phase shift of the phase shift film with respect to the exposure light is preferably 175 degrees or more and 185 degrees or less. In addition, the transmittance of the phase shift film with respect to the exposure light is preferably 6% or more and 30% or less, from which the resolution of the transfer pattern and the effect of the depth of focus due to the phase shift effect depending to the exposure condition are high. The thickness of the phase shift film is preferably 50 nm or more and 90 nm or less from the point of view of maintaining the phase shift and the transmittance within predetermined ranges.

Hereinafter, the structure of a photomask blank and a photomask according to the embodiment of the present invention and the method of manufacturing the photomask from the photomask blank are described with reference to the drawings, but the same components are denoted by the same reference numerals, and redundant description may be omitted in some cases. In addition, for the convenience, the drawings may be sometimes expanded, and dimensional ratios and the like of the respective components are not necessarily the same as actual ones.

FIG. 1 is a cross-sectional view illustrating an example of a first embodiment of a photomask blank according to the present invention. This photomask blank is a phase shift mask blank. The phase shift mask blank 511 includes, on a transparent substrate 1, a phase shift film (processing film) 21 which is a film made of a material containing silicon and is formed to be in contact with the transparent substrate 1, and a hard mask film 31 which is a film made of a material containing chromium and is formed to be in contact with the phase shift film 21. The hard mask film 31 is configured with a first layer (upper layer) 311, a second layer (intermediate layer) 312, and a third layer (lower layer) 313 from the side apart from the transparent substrate 1.

Figure 2:
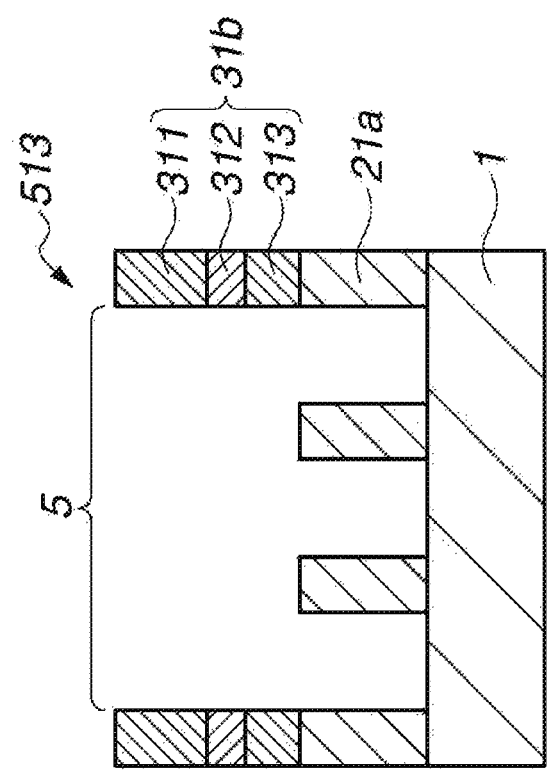
FIG. 2 is a cross-sectional view illustrating an example of a first embodiment (phase shift mask) of a photomask according to the present invention.

FIG. 2 is a cross-sectional view illustrating an example of a first embodiment of a photomask according to the present invention. This photomask is a phase shift mask. The phase shift mask 513 includes, on a transparent substrate 1, a phase shift film pattern 21a which is a film made of a material containing silicon and is formed to be in contact with the transparent substrate 1, and a light shielding film pattern 31b which is a film made of a material containing chromium and is formed to be in contact with the phase shift film pattern 21a in a portion located on an outer peripheral portion of the transparent substrate 1 which is a region where a circuit pattern is not formed, and a circuit pattern is formed in an effective region 5. The light shielding film pattern 31b is configured with a first layer (upper layer) 311, a second layer (intermediate layer) 312, and a third layer (lower layer) 313 from the side apart from the transparent substrate 1. The phase shift mask 513 illustrated in FIG. 2 can be manufactured from the phase shift mask blank 511 illustrated in FIG. 1.

A film made of a material containing silicon may be a single layer film or a multilayer film (for example, a film configured with two to four layers) and may be a film having a graded composition. It is preferable that the material containing silicon is a material that is resistant to chlorine-based dry etching and can be removed by fluorine-based dry etching. In the present invention, as the fluorine-based dry etching, typically, there may be exemplified dry etching using an etching gas containing fluorine such as $CF_4$ gas or $SF_6$ gas, and as the chlorine-based dry etching, typically, there may be exemplified dry etching using an etching gas containing chlorine and oxygen such as a mixed gas of $Cl_2$ gas and $O_2$ gas. It is preferable that the material containing silicon is a material containing silicon and being free of a transition metal or a material containing silicon and a transition metal (Me) other than chromium and being free of chromium.

As a material of the film containing silicon and being free of a transition metal, there may be exemplified a silicon simple substance (Si) and a silicon compound containing silicon (Si) and one or more selected from oxygen (O), nitrogen (N), and carbon (C). As such a material, there may be exemplified a material consisting of silicon (Si), a material consisting of silicon and oxygen (SiO), a material consisting of silicon and nitrogen (SiN), a material consisting of silicon, oxygen and nitrogen (SiON), a material consisting of silicon and carbon (SiC), a material consisting of silicon, oxygen and carbon (SiOC), a material consisting of silicon, nitrogen and carbon (SiNC), a material consisting of silicon, oxygen, nitrogen and carbon (SiONC), and the like.

On the other hand, as the material of the film containing silicon and a transition metal (Me) other than chromium and being free of chromium, there may be used a transition metal (Me), a transition metal (Me) silicon compound containing a transition metal (Me) and silicon (Si), or a transition metal (Me) silicon compound containing a transition metal (Me), silicon (Si), and one or more selected from oxygen (O), nitrogen (N), and carbon (C). As such a material, there may be exemplified a material consisting of a transition metal and silicon (MeSi), a material consisting of a transition metal, silicon and oxygen (MeSiO), a material consisting of a transition metal, silicon and nitrogen (MeSiN), a transition metal and a material consisting of silicon, oxygen and nitrogen (MeSiON), a material consisting of a transition metal, silicon and carbon (MeSiC), a material consisting of a transition metal, silicon, oxygen and carbon (MeSiOC), a material consisting of a transition metal, silicon, nitrogen and carbon (MeSiNC), a material consisting of a transition metal, silicon, oxygen, nitrogen and carbon (MeSiONC), and the like.

Herein, as the transition metal (Me) other than chromium, one or two selected from molybdenum (Mo), tungsten (W), tantalum (Ta), titanium (Ti), zirconium (Zr), and hafnium (Hf) is preferable. Particularly, molybdenum (Mo) is preferable from the point of view of dry etching processability. In addition, the material of the film made of the material containing silicon may contain hydrogen or the like.

On the other hand, in a case where the processing film is a film made of a material containing tantalum, an optical film such as an absorption film used for a reflective photomask is preferable as the film made of the material containing tantalum. In this case, the reflective photomask blank and the reflective photomask are provided with a reflection film formed to be in contact with a side of the absorption film close to the substrate. In this case, the absorption film and the reflection film can be an absorption film for the light in the extreme ultraviolet region and a reflection film for the light in the extreme ultraviolet region, respectively. The wavelength of light in the extreme ultraviolet region is generally 13 to 14 nm. In addition, it is preferable that the reflection film is a multilayer reflection film configured with multiple layers.

In a case where the film made of the material containing tantalum is an absorption film, the photomask blank is a reflective photomask blank (reflective mask blank), and a reflective photomask (reflective mask) is manufactured from the reflective photomask blank.

A reflective mask blank having a pattern of the absorption film including a circuit pattern (photomask pattern) on a substrate can be manufactured from the reflective mask blank. The thickness of the absorption film is preferably 50 nm or more, particularly preferably 60 nm or more, more preferably 110 nm or less, particularly preferably 100 nm or less. On the other hand, the thickness of the reflection film is preferably 200 nm or more, particularly preferably 220 nm or more, more preferably 340 nm or less, particularly preferably 280 nm or less.

Figure 3:
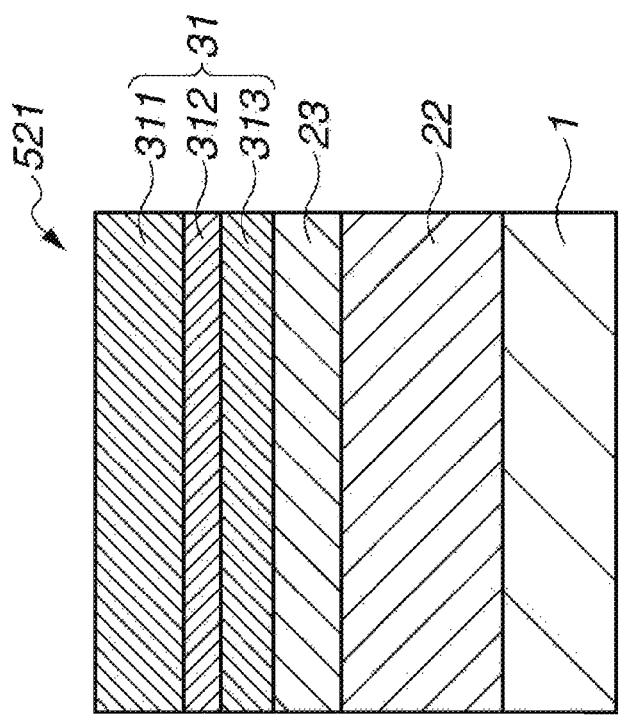
FIG. 3 is a cross-sectional view illustrating an example of a second embodiment (reflective mask blank) of the photomask blank according to the present invention.

FIG. 3 is a cross-sectional view illustrating an example of a second embodiment of a photomask blank according to the present invention. The photomask blank is a reflective mask blank. The reflective mask blank 521 includes, on a substrate 1, a reflection film 22 which is formed to be in contact with the substrate 1, an absorption film (processing film) 23 which is formed to be in contact with the reflection film 22 and which is a film made of a material containing tantalum, and a hard mask film 31 which is formed to be in contact with the absorption film 23 and which is a film made of the material containing chromium. In addition, the hard mask film 31 is configured with a first layer (upper layer) 311, a second layer (intermediate layer) 312, and a third layer (lower layer) 313 from the side apart from the substrate 1.

Figure 4:
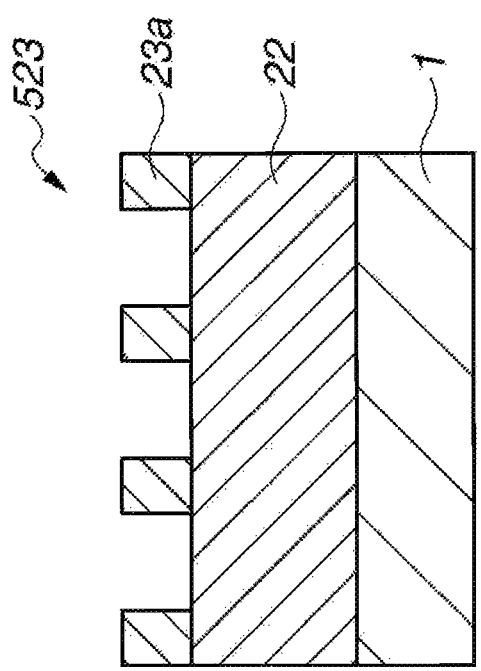
FIG. 4 is a cross-sectional view illustrating an example of a second embodiment (reflective mask) of a photomask according to the present invention.

FIG. 4 is a cross-sectional view illustrating an example of a second embodiment of a photomask according to the present invention. The photomask is a reflective mask. In the reflective mask 523, a reflection film 22 formed to be in contact with a substrate 1. and an absorption film pattern 23a which is formed to be in contact with the reflection film 22 and made of a material containing tantalum are formed on the substrate 1. The reflective mask 523 illustrated in FIG. 4 can be manufactured from the reflective mask blank 521 illustrated in FIG. 3.

A film made of a material containing tantalum may be a single layer film or a multilayer film (for example, a film configured with two to four layers) and may be a film having a graded composition. It is preferable that the material containing tantalum is a material that can be removed by dry etching using a chlorine-based gas (for example, $Cl_2$ gas) alone or a mixed gas of a chlorine-based gas (for example, $Cl_2$ gas) and a fluorine-based gas (for example, $CF_4$ gas or $SF_6$ gas) as an etching gas. As a material containing tantalum, for example, there may be exemplified a tantalum single substance (Ta) and a tantalum compound containing tantalum (Ta) and one or more selected from oxygen (O), nitrogen (N), boron (B), and the like. As such a material, there may be exemplified a material consisting of tantalum (Ta), a material consisting of tantalum and oxygen (TaO), a material consisting of tantalum and nitrogen (TaN), a material consisting of tantalum and boron (TaB), a material consisting of tantalum, boron and oxygen (TaBO), and a material consisting of tantalum, boron and nitrogen (TaBN), and the like.

On the other hand, it is preferable that the material constituting the reflection film is a material that is resistant to chlorine-based dry etching and can be removed by fluorine-based dry etching. As the material constituting the reflection film, there may be exemplified molybdenum (Mo), silicon (Si), or the like, and generally, a multilayer film in which about 20 to 60 layers of molybdenum layers and silicon layers are alternately stacked is used. In addition, a protection film for protecting the reflection film may be formed between the reflection film and the absorption film. The thickness of the protection film is preferably 2 nm or more and 20 nm or less. As a material constituting the protection film, there may be exemplified ruthenium (Ru) or the like.

In the present invention, the film made of the material containing chromium is a stacked film having a three-layer structure including a first layer, a second layer and a third layer from the side apart from the substrate, and each of the first layer, the second layer and the third layer contains chromium, oxygen, and nitrogen. It is preferable that the material containing chromium is a material that is resistant to fluorine-based dry etching and can be removed by chlorine-based dry etching. It is preferable that the material containing chromium, oxygen, and nitrogen are free of silicon. As the material containing chromium, oxygen, and nitrogen, a material (CrON) made of chromium (Cr), oxygen (O) and nitrogen (N) is suitable.

As the film made of the material containing chromium, an optical film such as a light shielding film and an antireflection film of a transmissive photomask, or a hard mask film to be functioned as an etching mask at the time of etching of a film made of the material containing silicon which is in contact with the film made of the material containing chromium is suitable. In a case where the film made of the material containing chromium is a light shielding film, each layer can be selected from a light shielding layer and an antireflection layer. For example, the first layer may be configured as an antireflection layer, the second layer may be configured as a light shielding layer, and the third layer may be configured as an antireflection layer. It is preferable that the film made of the material containing chromium is allowed to function as, particularly, as a hard mask film when etching the film made of the material containing silicon and then is allowed to remain on a portion of the film made of the material containing silicon, specifically, the film made of the material containing chromium is allowed to remain in a portion located on outer peripheral portion of the substrate which is a region where a circuit pattern of the film made of the material containing silicon is not formed, and to be used as a light shielding film.

In addition, as the film made of the material containing chromium, an optical film such as an absorption film of a reflective photomask, or a hard mask film to be functioned as an etching mask at the time of etching of a film made of the material containing tantalum which is in contact with the film made of the material containing chromium is suitable.

In the film made of the material containing chromium according to the present invention, the composition of the first layer (upper layer) which is the layer on the side apart from the substrate is such that a chromium content is 40 atomic % or less, an oxygen content is 50 atomic % or more, and a nitrogen content is 10 atomic % or less. The chromium content of the first layer is preferably 38 atomic % or less, and preferably 30 atomic % or more, more preferably 35 atomic % or more. The oxygen content of the first layer is preferably 53 at % or more, and preferably 60 at % or less, more preferably 58 at % or less. The nitrogen content of the first layer is preferably 8 atomic % or less, and preferably 3 atomic % or more, more preferably 5 atomic % or more. A thickness of the first layer is 20 nm or more. The thickness of the first layer is preferably 24 nm or more, and preferably 40 nm or less, more preferably 34 nm or less.

In a case of manufacturing the photomask from the photomask blank, the first layer is a layer which is in direct contact with a cleaning solution and is a layer which is in contact with a resist film. In a case of exposure using the photomask, the first layer is a layer in the film made of the material containing chromium on which exposure light is incident and which is located on the side apart from the substrate. For this reason, the first layer is required to have high chemical resistance to the cleaning solution, high adhesion to the resist film, and difficulty in reflecting the exposure light.

As compared with chromium oxide (CrO), chromium oxynitride (CrON) does not dissolve in a mixed solution of sulfuric acid and hydrogen peroxide water, ammonia added water (ammonia added hydrogen peroxide water, APM), or the like and can stabilize and maintain optical characteristics. In addition, as compared with chromium nitride (CrN), chromium oxynitride (CrON) has low reflectance with respect to exposure light, and at the time of exposure using a photomask (at the time of transfer of a photomask pattern), reflection of the exposure light on an object to be transferred can be suppressed. For this reason, it is advantageous that the film made of the material containing chromium is used as a light shielding film. In addition, chromium oxynitride (CrON) has good adhesion to a resist film, and even if the resist film is removed from the film made of the material containing chromium by using a mixed solution of sulfuric acid and hydrogen peroxide water, as compared with chromium nitride (CrN), in chromium oxide (CrO), sulfate ions are hard to remain on the surface, so that even if a resist film is formed again, the adhesion to the resist film is hard to be deteriorated. From the point of view, the first layer is made of the material containing chromium, oxygen and nitrogen, and thus, the first layer has the above-described predetermined composition which is an oxygen-rich composition having a relatively high oxygen content.

In addition, since the first layer is in contact with the second layer, if the first layer is too thin, for the reason described later, at the time of forming the first layer, due to the influence of nitrogen in the second layer having a nitrogen-rich composition having a relatively high nitrogen content, the composition of the first layer on the side close to the second layer has relatively high nitrogen content and low oxygen content over the entire thickness direction of the first layer, so that the first layer is hard to set to the above-mentioned predetermined composition. For this reason, from the point of view of reducing the influence of the second layer, the thickness of the first layer is set to 20 nm or more.

In the film made of the material containing chromium according to the present invention, the composition of the second layer (intermediate layer) which is the layer interposed between the first layer and the third layer is such that a chromium content is 50 atomic % or more, an oxygen content is 20 atomic % or less, and a nitrogen content is 30 atomic % or more. The chromium content of the second layer is preferably 52 atomic % or more, and preferably 70 atomic % or less, more preferably 60 atomic % or less. The oxygen content of the second layer is preferably 15 atomic % or less, and preferably 5 atomic % or more, more preferably 10 atomic % or more. The nitrogen content of the second layer is preferably 35 atomic % or more, and preferably 50 atomic % or less, more preferably 40 atomic % or less. A thickness of the second layer is preferably 5 nm or less, and preferably 2 nm or more.

A resist film is formed on the surface of the film made of the material containing chromium, but if a pattern is drawn on a resist film by using an electron beam, when a sheet resistance of the film made of the material containing chromium is high, the surface layer portion of the film made of the material containing chromium is electrically charged by the electron beam, and thus, the irradiation position of the electron beam is shifted, so that the electron beam is not irradiated to a predetermined position. In that case, a pattern is not formed at a predetermined position, and as a result, the circuit of a device to be manufactured is not correctly formed, which causes a malfunction of the device. For this reason, it is preferable that the sheet resistance of the film made of the material containing chromium is low. For the reasons described above, the first layer is made of the material containing chromium, oxygen and nitrogen to have an oxygen-rich composition having a relatively high oxygen content. However, a sheet resistance of chromium oxide (CrO) is higher than that of chromium nitride (CrN). Therefore, the sheet resistance of the first layer which is chromium oxynitride (CrON) having an oxygen-rich composition is relatively high. Therefore, from the point of view of a sheet resistance of the entire film made of the material containing chromium, a second layer which is in contact with the first layer is provided, and the second layer is made of the material containing chromium, oxygen and nitrogen, so that the above-mentioned composition which is a nitrogen-rich composition having a relatively high nitrogen content.

In addition, the second layer has a nitrogen-rich composition having a relatively high nitrogen content, and chromium nitride (CrN) has a lower etching rate in chlorine-based dry etching than nitrogen oxide (CrO). Therefore, the second layer which is chromium oxynitride (CrON) having a nitrogen-rich composition has a relatively low etching rate. As the etching time of the film made of the material containing chromium becomes longer, a resist film needs to be thickened. As the resist film is thickened, the resolution of the line pattern, particularly, the assist pattern of the line pattern is deteriorated. From the point of view of reducing the etching time of the second layer in this manner, a thickness of the second layer is preferably 5 nm or less. Accordingly, relatively, a thickness of the resist film formed on the film made of the material containing chromium can be reduced.

In the film made of the material containing chromium according to the present invention, the composition of the third layer (lower layer) which is the layer on the side close to the substrate is such that a chromium content is 40 atomic % or less, an oxygen content is 50 atomic % or more, and a nitrogen content is 10 atomic % or less. The chromium content of the third layer is preferably 38 at % or less, and preferably 30 at % or more, more preferably 35 at % or more. The oxygen content of the third layer is preferably 54 atomic % or more, and preferably 65 atomic % or less, more preferably 60 atomic % or less. The nitrogen content of the third layer is preferably 8 atomic % or less, and preferably 2 atomic % or more, more preferably 5 atomic % or more. A thickness of the third layer is preferably 5 nm or more, more preferably 10 nm or more, and is preferably 50 nm or less, more preferably 40 nm or less.

In the exposure using the photomask, the third layer is a layer in the film made of the material containing chromium on which is the exposure light is incident and which is located on the side close to the substrate. For this reason, the third layer is required to have difficulty in reflecting the exposure light. As compared with chromium nitride (CrN), chromium oxynitride (CrON) has lower reflectance with respect to the exposure light, and at the time of exposure using a photomask (at the time of transfer of a photomask pattern), reflection of the exposure light on the transfer object can be suppressed. From the point of view, the third layer is made of the material containing chromium, oxygen and nitrogen, and thus, the third layer has the above-mentioned predetermined composition which is an oxygen-rich composition having a relatively high oxygen content.

In addition, since the first layer and the second layer have limitations as described above, in a case where it is necessary to secure a higher optical density over the entire film made of the material containing chromium, the optical density is compensated for by the third layer. From the point of view, a thickness of the third layer is preferably 5 nm or more.

A sheet resistance of the film made of the material containing chromium is, as a sheet resistance of a combination of the first layer and the second layer, preferably, as a sheet resistance of a combination of the first layer, the second layer and the third layer, preferably 150 kΩ/□ or less, more preferably 100 kΩ/□ or less. Due to the above-mentioned characteristics of the first layer, the second layer and the third layer, the film made of the material containing chromium having such a sheet resistance may be used.

In a case where the film made of the material containing chromium is a light shielding film, particularly, when being used as a photomask, in a case of remaining as a light shielding film in a portion located on the outer peripheral portion of the substrate which is a region where a circuit pattern of the film made of the material containing silicon is not formed, the optical density (OD) of a combination of the film made of the material containing silicon which is the phase shift film and the light shielding film is set to higher than 2.0, particularly, 2.5 or more with respect to the exposure light, for example, light having a wavelength of 250 nm or less, particularly light having a wavelength of 200 nm or less such as ArF excimer laser (193 nm) and $F_2$ laser (wavelength 157 nm). However, generally, the optical density is preferably 3 or more. For example, in a case where the film made of the material containing silicon is a phase shift film having a transmittance for the exposure light of 6% or more and 30% or less (optical density of 0.53 or more and 1.22 or less), in order to set the optical density of a combination of the phase shift film and the light shielding film to 3 or more, the optical density of the film (sum of the first layer, the second layer and the third layer) made of the material containing chromium with respect to the exposure light is required to be 1.78 or more. Due to the above-described characteristics of the first layer, the second layer and the third layer, the film made of the material containing chromium having such optical density can be obtained. In addition, the upper limit of the optical density with respect to the exposure light of the film (total of the first layer, the second layer and the third layer) made of the material containing chromium is generally 3.2 or less.

A thickness (the total thickness of the first layer, the second layer and the third layer) of the film made of the material containing chromium is preferably 31 nm or more, more preferably 40 nm or more, and is preferably 95 nm or less, more preferably 65 nm or less. In particular, when the film made of the material containing chromium is used as a photomask, in a case of remaining as a light shielding film in a portion located on an outer peripheral portion of the substrate which is a region where a circuit pattern of the film made of the material containing silicon is not formed, the thickness of the film made of the material containing chromium is preferably 40 nm or more, more preferably 42 nm or more and is preferably 65 nm or less, more preferably 60 nm or less.

In any one of the first layer, the second layer and the third layer, as long as the layer contains a small amount of carbon, a content of carbon is preferably less than 5 atomic %, more preferably 3 atomic % or less, most preferably 2 atomic % or less, and particularly, in each of the layers, the layer is preferably free of carbon. As a material containing chromium, oxygen, nitrogen and carbon, there may be exemplified a material (CrONC) consisting of chromium (Cr), oxygen (O), nitrogen (N) and carbon (C).

The photomask blank according to the present invention may further include a resist film that is in contact with the side of the film made of the material containing chromium apart from the substrate. The resist film may be an electron beam resist to be drawn with an electron beam or a photoresist to be drawn by light, particularly preferably a chemically amplified resist. The chemically amplified resist may be either a positive type or a negative type and may include, for example, a base resin such as a hydroxystyrene-based resin or a (meth) acrylic acid-based resin and an acid generator, and optionally, a crosslinking agent, a quencher, a surfactant, and the like. From the point of view of preventing the resist pattern from collapsing in the developing process or the rinsing process after development during the formation of the fine pattern, a thickness of the resist film is preferably 50 nm or more, more preferably 70 nm or more, and is preferably 200 nm or less, more preferably 150 nm or less.

FIG. 5 is a cross-sectional view illustrating another example of the first embodiment of the photomask blank according to the present invention. This photomask blank is a phase shift mask blank. In the phase shift mask blank 512, a resist film 4 is formed to be in contact with the hard mask film 31 of the photomask blank illustrated in FIG. 1. The phase shift mask 513 illustrated in FIG. 2 can also be manufactured from the phase shift mask blank 512 illustrated in FIG. 5.

On the other hand, FIG. 6 is a cross-sectional view illustrating another example of the second embodiment of the photomask blank according to the present invention. This photomask blank is a reflective mask blank. In the reflective mask blank 522, the resist film 4 is formed to be in contact with the hard mask film 31 of the photomask blank illustrated in FIG. 3. The reflective mask 523 illustrated in FIG. 4 can also be manufactured from the reflective mask blank 522 illustrated in FIG. 6.

A method for forming of the film made of the material containing chromium, the film made of material containing silicon, the film made of the material containing tantalum, and the reflection film according to the present invention are not particularly limited. However, forming method by the sputtering is preferable because of good controllability and easy formation of films having predetermined characteristics. As the sputtering method, DC sputtering, RF sputtering, and the like can be applied, and there is no particular limitation.

In a case of forming a film containing chromium and being free of silicon as the film made of the material containing chromium, a chromium target can be used as a sputtering target. On the other hand, in a case of forming a film containing silicon and being free of a transition metal as the film made of the material containing silicon, a silicon (Si) target can be used as a sputtering target. In a case of forming a film containing silicon and a transition metal (Me) other than chromium and being free of chromium as the film made of the material containing silicon, a target containing silicon and a transition metal (Me) other than chromium can be used as a sputtering target. In this case, co-sputtering may be performed by using a silicon (Si) target and a transition metal (Me) target other than chromium, by using a plurality of targets containing silicon and a transition metal (Me) other than chromium and having different compositions (a portion or all of components are different or the components are the same but the concentrations are different), or by using a silicon (Si) target, a transition metal (Me) target other than chromium, and a target containing silicon and a transition metal (Me) other than chromium. In addition, in a case of forming a film made of a material containing tantalum, a tantalum (Ta) target, a target consisting of tantalum and boron (TaB), or the like can be used as a sputtering target. Furthermore, in a case of forming a reflection film, generally, a molybdenum (Mo) target or a silicon (Si) target is used, and in a case of forming a protection film, generally, a ruthenium (Ru) target is used.

The power applied to the sputtering target may be appropriately set depending on the size of the sputtering target, the cooling efficiency, easiness of control of film formation, and the like. It is preferable that the power per area of the sputtering are is generally 0.1 to 10 W/cm$^2$.

In a case of forming a film of a material containing only silicon or containing only silicon and a transition metal, a rare gas such as a helium gas (He), a neon gas (Ne), or an argon gas (Ar) is used as a sputtering gas. On the other hand, in a case of forming a film made of a material containing oxygen, nitrogen, or carbon, reactive sputtering is preferable as the sputtering. As the sputtering gas, a rare gas such as a helium gas (He), a neon gas (Ne), or an argon gas (Ar) and a reactive gas are used. For example, when forming a film made of a material containing oxygen, an oxygen gas ($O_2$ gas) may be used as a reactive gas, and when forming a film made of a material containing nitrogen, a nitrogen gas ($N_2$ gas) may be used as a reactive gas. In addition, when forming a film made of a material containing both nitrogen and oxygen, oxygen gas ($O_2$ gas) and nitrogen gas ($N_2$ gas) may be used simultaneously as the reactive gas, or a nitrogen monoxide gas (NO gas), a nitrogen dioxide gas ($NO_2$ gas), a nitrous oxide gas ($N_2O$ gas), or the like may be used. When forming a film made of a material containing carbon, a gas containing carbon such as a methane gas ($CH_4$), a carbon monoxide gas (CO gas), or a carbon dioxide gas ($CO_2$ gas) may be used as the reactive gas.

The pressure at the time of film formation may be appropriately set in consideration of film stress, chemical resistance, cleaning resistance, and the like. Generally, by setting the pressure to 0.01 Pa or more, particularly 0.03 Pa or more and 1 Pa or less, particularly 0.3 Pa or less, the chemical resistance is improved. In addition, the flow rate of each gas may be appropriately set so as to obtain a desired composition, and usually, the flow rate may be set to 0.1 to 100 sccm.

In the processes of manufacturing the photomask blank, heat treatment may be performed on a substrate, or on a substrate and a film formed on the substrate. As a method for the heat treatment, there may be applied infrared heating, resistance heating, or the like, and the processing conditions are also not particularly limited. The heat treatment can be performed, for example, in a gas atmosphere containing oxygen. The concentration of the gas containing oxygen is not particularly limited, and for example, in a case of oxygen gas ($O_2$ gas), the concentration of the gas may be, for example, 1 to 100 vol %. The temperature of the heat treatment is preferably 200° C. or more, more preferably 400° C. or more. In addition, in the processes of manufacturing the photomask blank, ozone treatment, plasma treatment, or the like may be performed on a film formed on the substrate, particularly, the film made of the material containing chromium, and the processing conditions are also not particularly limited. Any of these treatments can be performed for purpose of increasing oxygen concentration in the surface portion of the film, and in this case, the treatment conditions may be appropriately adjusted so as to obtain a predetermined oxygen concentration. In addition, in a case of forming the film by sputtering, by adjusting the ratio of a rare gas and a gas containing oxygen such as an oxygen gas ($O_2$ gas), a carbon monoxide gas (CO gas), and a carbon dioxide gas ($CO_2$ gas) in the sputtering gas, the oxygen concentration in the surface portion of the film can be increased.

In the processes of manufacturing the photomask blank, a cleaning process may be performed in order to remove particles existing on the substrate or the surface of a film formed on a substrate. The cleaning may be performed by using one or both of ultra-pure water and functional water which is ultra-pure water containing an ozone gas, hydrogen gas, or and the like. In addition, after cleaning with ultra-pure water containing a surfactant, cleaning may be further performed by using one or both of ultra-pure water and the functional water. The cleaning may be performed while irradiating ultrasonic waves if needed, and UV light irradiation may also be combined.

In a case of forming a resist film on the photomask blank according to the present invention, the method of applying the resist film is not particularly limited, and a known method can be applied.

Figure 7A:
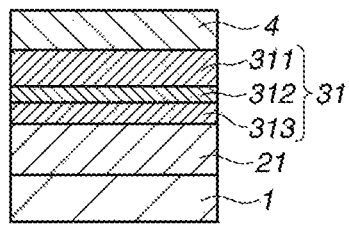
FIGS. 7A to 7I are cross-sectional views illustrating processes of manufacturing a phase shift mask from a phase shift mask blank according to a first embodiment of the present invention.
Figure 7B:
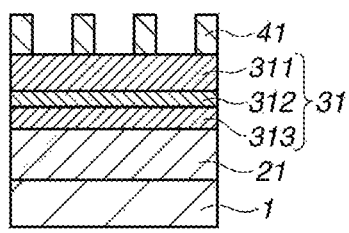
Figure 7C:
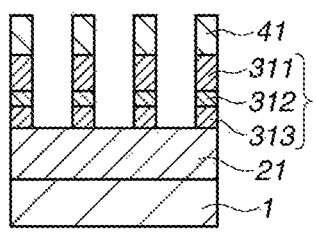
Figure 7D:
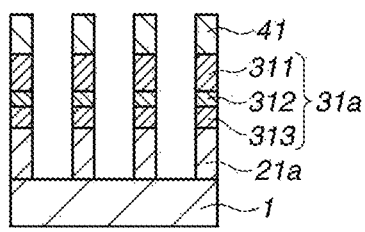

A photomask can be manufactured from the photomask blank according to the present invention. FIGS. 7A to 7I are cross-sectional views illustrating processes of manufacturing a phase shift mask from a phase shift mask blank according to the first embodiment of the present invention. In this case, first, as illustrated in FIG. 7A, the resist film (preferably having a thickness of 50 nm or more and 200 nm or less) 4 is formed to be in contact with the side of the film (hard mask film 31) made of a material containing chromium apart from the transparent substrate 1 (step (A)). Next, as illustrated in FIG. 7B, the resist film 4 is patterned to form a resist pattern 41 (step (C)). Next, as illustrated in FIG. 7C, by using the resist pattern 41 as an etching mask, a film (hard mask film 31) made of the material containing chromium including a first layer 311, a second layer 312 and a third layer 313 is patterned by chlorine-based dry etching to form a film pattern (hard mask film pattern 31a) made of the material containing chromium (step (D)). Next, as illustrated in FIG. 7D, by using the film pattern (hard mask film pattern 31a) made of the material containing chromium as an etching mask, a film (phase shift film 21) made of the material containing silicon is patterned by fluorine-based dry etching to form a film pattern (phase shift film pattern 21a) made of the material containing silicon (step (E)). Next, if required, a photomask (phase shift mask) can be obtained by appropriately removing the remaining resist pattern 41 and the pattern (hard mask film pattern 31a) of the film made of the material containing chromium.

Figure 7E:
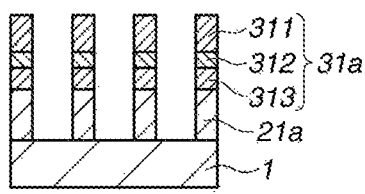
Figure 7F:
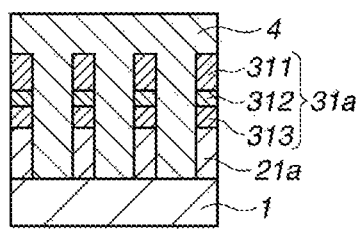
Figure 7G:
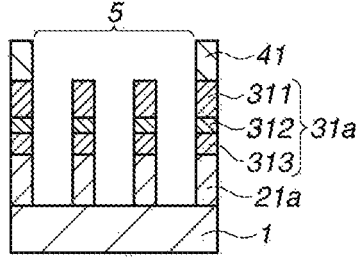
Figure 7H:
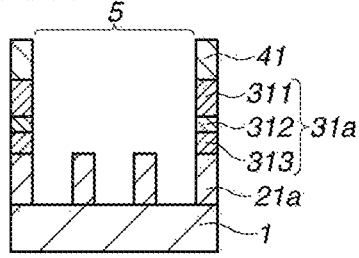
Figure 7I:
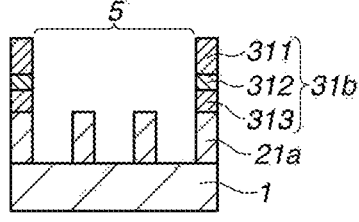

In a case of allowing the film made of the material containing chromium on an outer peripheral portion of the transparent substrate which is a region where a circuit pattern of the film made of the material containing silicon is not formed to remain, after the step (E), the film made of the material containing chromium is allowed to remain in the portion located on an outer peripheral portion of the transparent substrate which is the region where the circuit pattern of the film made of the material containing silicon is not formed, and a pattern of the film made of the material containing chromium other than the outer peripheral portion is removed by dry etching using a chlorine-based gas containing oxygen (step (F)). In this case, in the step (F), after the step (E), first, as illustrated in FIG. 7E, the remaining resist pattern 41 is removed. Next, as illustrated in FIG. 7F, a new resist film 4 is formed on the transparent substrate 1 and the pattern (hard mask film pattern 31a) of the film made of the material containing chromium. Next, as illustrated in FIG. 7G, a resist pattern 41 is formed by patterning the resist film 4 so that the resist film 4 remains in a portion located on an outer peripheral portion of the transparent substrate 1 which is a region where the circuit pattern (phase shift film pattern 21a) of the film made of the material containing silicon is not formed. Next, as illustrated in FIG. 7H, a pattern (hard mask film pattern 31a) of the film made of the material containing chromium in a circuit pattern (mask pattern) forming region is removed by chlorine dry etching using the resist pattern 41 as an etching mask. Finally, as illustrated in FIG. 7I, by removing the remaining resist pattern 41, it is possible to obtain a photomask (phase shift mask) where a circuit pattern (phase shift film pattern 21a) of the film made of the material containing silicon is formed in the effective region 5, and the light shielding film pattern 31b remains in a portion located on an outer peripheral portion of the transparent substrate which is a region where a circuit pattern of the film made of the material containing silicon is not formed.

Figure 8A:
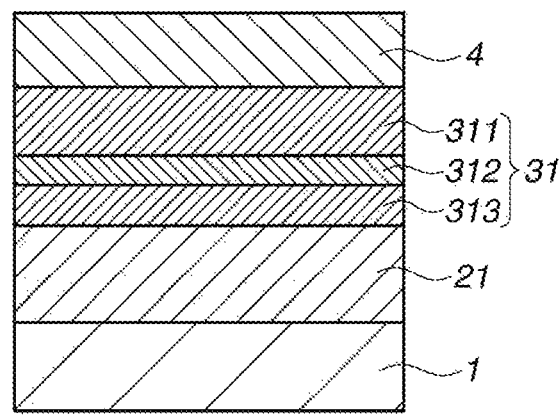
FIGS. 8A to 8C are cross-sectional views illustrating a procedure of a step (B) in the process of manufacturing a phase shift mask from a phase shift mask blank according to a first embodiment of the present invention.
Figure 8B:
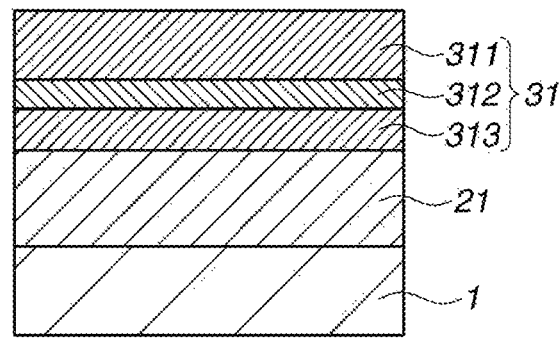
Figure 8C:
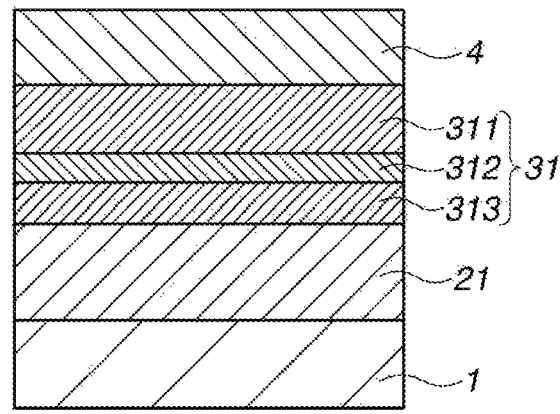

In the photomask blank according to the present invention, before the steps (A) and (C), a step (step (B)) of removing the resist film formed in the step (A) by using a mixed solution (sulfuric acid/hydrogen peroxide, SPM) of sulfuric acid and hydrogen peroxide water and newly forming a resist film (preferably having a thickness of 50 nm or more and 200 nm or less) to be in contact with the side of the exposed film made of the material containing chromium apart from the transparent substrate may be performed. FIGS. 8A to 8C are cross-sectional views illustrating a procedure in a case where the step (B) is performed on a phase shift mask blank according to the first embodiment of the present invention. In this case, first, as illustrated in FIG. 8A, the resist film 4 is removed by using a mixed solution of sulfuric acid and hydrogen peroxide water as illustrated in FIG. 8B from the state, which the step (A) has been performed, where the resist film 4 is formed to be in contact with the side of the film (hard mask film 31) made of the material containing chromium apart from the transparent substrate 1. Next, as illustrated in FIG. 8C, a resist film 4 is newly formed to be in contact with the side of the film (hard mask film 31) made of the material containing chromium apart from the transparent substrate 1. The step (B) can be repeated twice or more if required.

As a method of manufacturing a photomask from a photomask blank according to the present invention, the method of manufacturing the phase shift mask from the phase shift mask blank has been described as an example in FIGS. 7 and 8. However, in a case of manufacturing a reflective mask from a reflective mask blank, an etching condition is selected according to the etching characteristics of each film, an absorption film pattern is formed by a known method in a related art, and the reflective mask having a reflection film and an absorption film pattern can be manufactured from the reflective mask blank having a reflection film and an absorption film.

A photomask according to the present invention is particularly effective to the exposure of transferring a pattern on a photoresist film formed on a processing substrate by using exposure light having a wavelength of 250 nm or less, particularly a wavelength of 200 nm or less such as ArF excimer laser (wavelength 193 nm) or $F_2$ laser (wavelength 157 nm) or using light in an extreme ultraviolet region having a wavelength of 13 to 14 nm as exposure light in photolithography for forming a pattern having a half pitch of 50 nm or less, preferably 30 nm or less, more preferably 20 nm or less, and even more preferably 10 nm or less on the on the processing substrate.

In the pattern exposure method using a photomask according to the present invention, the photomask manufactured from a photomask blank is used, and the photomask pattern is irradiated with exposure light, so that the photomask pattern is transferred onto a photoresist film which is an exposure object of the photomask pattern formed on a processing substrate. The irradiation with exposure light may be performed in exposure under dry conditions or in liquid immersion exposure, and particularly, the irradiation with exposure light can be appropriately used for exposing the photomask pattern by liquid immersion exposure using a wafer of 300 mm or more as a processing substrate.

EXAMPLES

Hereinafter, the present invention is specifically described with reference to Examples and Comparative Examples, but the present invention is not limited to the following examples.

Example 1

A photomask blank (halftone phase shift mask blank) where a phase shift film (halftone phase shift film) as a film made of a material containing silicon and a hard mask film as a film made of a material containing chromium are stacked on a transparent substrate being made of quartz and having a size of 152 mm square and a thickness of about 6 mm was manufactured.

First, by using a molybdenum target and a silicon target as a targets, adjusting the power applied to the targets, and using argon gas and nitrogen gas as sputtering gas, sputtering was performed in these gas atmospheres on the transparent substrate, so that a MoSi-based phase shift film (thickness of 70 nm) being made of MoSiN and having a phase shift of 177 degrees and having a transmittance of 20% (optical density of 0.7), with respect to light having a wavelength of 193 nm was formed as a single layer film.

Next, by using a chromium target as a target, adjusting the power applied to the target, using argon gas, oxygen gas, and nitrogen gas as sputtering gas, and adjusting the ratio of the sputtering gas, sputtering is performed on the phase shift film in the order of the third layer (lower layer), the second layer (intermediate layer), and the first layer (upper layer) in these gas atmospheres, so that the hard mask film including the first layer, the second layer and the third layer from the side apart from the transparent substrate, each of the layers being made of chromium oxynitride (CrON) was formed to obtain a photomask blank having no resist film as illustrated in FIG. 1. Table 1 lists the composition and thickness of each layer of the hard mask film and the optical density of the entire hard mask film with respect to light having a wavelength of 193 nm. In addition, the composition was measured by using an X-ray photoelectron spectrometer K-Alpha manufactured by Thermo Fisher Scientific Co., Ltd., the thickness of the film (layer) was measured by using a stylus step profiler P-16+ manufactured by KLA-Tencor Corporation, and the optical density was measured by using a UV-visible near infrared spectrophotometer SolidSpec-3700 manufactured by Shimadzu Corporation (hereinafter the same).

Next, a resist film having a thickness of 150 nm was formed by spin-coating a negative chemically amplified electron beam resist SEBN 3015 (manufactured by Shin-Etsu Chemical Co., Ltd.) on the hard mask film, and thus, a photomask blank including a resist film as illustrated in FIG. 5 was obtained.

Comparative Example 1

In the same manner as in Example 1 except that the composition and thickness of the first layer and the thickness of the third layer of the hard mask film were changed so that the optical density of the entire hard mask film was the same as in Example 1, a phase shift film and a hard mask film were formed on a transparent substrate to obtain a photomask blank having no resist film, and a resist film was further formed on the hard mask film to form a photomask blank including a resist film. Table 1 lists the composition and thickness of each layer of the hard mask film and the optical density of the entire hard mask film with respect to light having a wavelength of 193 nm.

Example 2

In order to evaluate the resolution limit of the fine pattern corresponding to the assist pattern of the line pattern, a photomask (halftone phase shift mask) as illustrated in FIG. 2 was manufactured according to the processes illustrated in FIG. 7 by using the photomask blank provided with the resist film obtained in Example 1.

First, a photomask blank including a resist film was prepared (FIG. 7A). Next, as a test pattern corresponding to the assist pattern of the line pattern, a total of 200,000 isolated patterns with different short side dimension, having the long side dimension of 140 nm and the short side dimension varying from 20 nm to 100 nm by 2 nm, were drawn by using an electron beam drawing apparatus at a dose amount of 35 µC/cm². After that, heat treatment (PEB: Post Exposure Bake) was performed at 110° C. for 14 minutes by using a heat treatment apparatus. Next, development processing was performed for 100 seconds by paddle development to form a resist pattern (FIG. 7B). Next, chlorine-based dry etching was performed on the hard mask film by using a chlorine-based gas containing an oxygen gas under the following conditions to form a hard mask film pattern (FIG. 7C). Next, fluorine-based dry etching was performed on the phase shift film by using a fluorine-based gas under the following conditions to form a phase shift film pattern (FIG. 7D).

<Chlorine Dry Etching Conditions>
Apparatus: Inductively Coupled Plasma (ICP) Type
Gas: $Cl_2$ gas+O2 gas
Gas pressure: 3.0 mTorr (0.40 Pa)
ICP power: 350 W <Fluorine Dry Etching Conditions>
Apparatus: ICP
Gas: $SF_6$ gas+He gas
Gas pressure: 4.0 mTorr (0.53 Pa)
ICP power: 400 W Next, the resist pattern was removed by cleaning with sulfuric acid/hydrogen peroxide (mixture of a sulfuric acid and a hydrogen peroxide water (sulfuric acid:hydrogen peroxide water=3:1)) (FIG. 7E). Next, a resist film was formed on the transparent substrate and the hard mask film pattern by spin coating with a laser drawing resist IP 3000 (manufactured by Tokyo Oka Kogyo Co., Ltd.) (FIG. 7F). Next, by using a laser drawing apparatus, an effective region including the circuit pattern of the phase shift film was drawn so as to allow the resist film to remain in a portion located on the outer peripheral portion of the transparent substrate. After that, heat treatment (PEB) was performed at 110° C. for 20 minutes by using a heat treatment apparatus. Next, development processing was performed for 200 seconds by spray development to form a resist pattern (FIG. 7G). Next, chlorine-based dry etching was performed on the hard mask film pattern by using a chlorine-based gas containing an oxygen gas under the above conditions, and thus, the hard mask film pattern was removed (FIG. 7H). Next, the resist pattern was removed by cleaning with sulfuric acid/hydrogen peroxide (FIG. 7I) to obtain a photomask.

Next, the resolution limit of the test pattern of the obtained photomask was evaluated by using an appearance inspection apparatus. With respect to all of the isolated patterns with different short side dimensions having a long side dimension of 140 nm and a short side dimension varying from 20 nm to 100 nm by 2 nm, pattern loss, pattern collapse, and pattern shape failure were evaluated, an appearance inspection apparatus determines an isolated pattern in which any one of the pattern loss, the pattern collapse, and the pattern shape failure was detected as a defect, and a minimum short side dimension without an isolated pattern in which the defect was detected was defined as the resolution limit. The results are listed in Table 2.

Comparative Example 2

In order to evaluate the resolution limit of the fine pattern corresponding to the assist pattern of the line pattern, a photomask (halftone phase shift mask) was manufactured in the same manner as in Example 2 according to the processes illustrated in FIG. 7 by using the photomask blank provided with the resist film obtained in Comparative Example 1, and the resolution limit of the fine pattern was evaluated. The evaluation results are listed in Table 2.

As listed in Table 2, as compared with the phase shift mask blank according to Comparative Example 1, in the phase shift mask blank according to Example 1, which is the photomask blank according to the present invention, it was confirmed that the resolution limit of the line pattern reached the finer line width, and the phase shift mask blank according to Example 1 was superior in resolution. It is considered that this is because the first layer of the hard mask film of the photomask blank according to the present invention causes good adhesion to the resist film.

Example 3

In order to evaluate the influence of removing of the resist film formed on the film made of the material containing chromium on the basis of the resolution limit of a fine pattern corresponding to an assist pattern of a line pattern, a photomask (halftone phase shift mask) as illustrated in FIG. 2 was manufactured according to the processes illustrated in FIGS. 8 and 7 by using the photomask blank having the resist film obtained in Example 1.

First, a photomask blank including a resist film was prepared (FIG. 8A). Next, the resist film was removed by cleaning with sulfuric acid/hydrogen peroxide for 12 minutes. After that, in order to neutralize the sulfate ions remaining on the surface of the hard mask film (first layer), rinsing was performed by using ammonia added water (ammonia added hydrogen peroxide water, APM) for 15 minutes, and in order to reduce the ammonia added water from the surface of the hard mask film (first layer), dry spin rinsing was performed for 15 minutes (FIG. 8B). Next, a resist film having a thickness of 150 nm was formed by spin-coating a negative chemically amplified electron beam resist SEBN 3015 (manufactured by Shin-Etsu Chemical Co., Ltd.) on the hard mask film (FIG. 8C or FIG. 7A).

Next, as a test pattern corresponding to the assist pattern of the line pattern, a total of 200,000 isolated patterns with different short side dimension, having the long side dimension of 140 nm and the short side dimension varying from 20 nm to 100 nm by 2 nm, were drawn by using an electron beam drawing apparatus at a dose amount of 35 µC/cm². After that, heat treatment (PEB) was performed at 110° C. for 14 minutes using a heat treatment apparatus. Next, development processing was performed for 100 seconds by paddle development to form a resist pattern (FIG. 7B). Next, chlorine-based dry etching was performed on the hard mask film by using a chlorine-based gas containing an oxygen gas under the same conditions as those in Example 1 to form a hard mask film pattern (FIG. 7C). Next, fluorine-based dry etching was performed on the phase shift film by using a fluorine-based gas under the same conditions as those in Example 1 to form a phase shift film pattern (FIG. 7D).

Next, the resist pattern was removed by cleaning with sulfuric acid/hydrogen peroxide (FIG. 7E). Next, a resist film was formed on the transparent substrate and the hard mask film pattern by spin coating with a laser drawing resist IP 3000 (manufactured by Tokyo Oka Kogyo Co., Ltd.) (FIG. 7F). Next, by using a laser drawing apparatus, an effective region including the circuit pattern of the phase shift film was drawn so as to allow the resist film to remain in a portion located on the outer peripheral portion of the transparent substrate. After that, heat treatment (PEB) was performed at 110° C. for 20 minutes by using a heat treatment apparatus. Next, development processing was performed for 200 seconds by spray development to form a resist pattern (FIG. 7G). Next, chlorine-based dry etching was performed on the hard mask film pattern by using a chlorine-based gas containing an oxygen gas under the same conditions as those in Example 1, and thus, the hard mask film pattern was removed (FIG. 7H). Next, the resist pattern was removed by cleaning with sulfuric acid/hydrogen peroxide (FIG. 7I) to obtain a photomask.

Next, the resolution limit of the test pattern of the obtained photomask was evaluated by using an appearance inspection apparatus. With respect to all of the isolated patterns with different short side dimensions having a long side dimension of 140 nm and a short side dimension varying from 20 nm to 100 nm by 2 nm, pattern loss, pattern collapse, and pattern shape failure were evaluated, an appearance inspection apparatus determines an isolated pattern in which any one of the pattern loss, the pattern collapse, and the pattern shape failure was detected as a defect, and a minimum short side dimension without an isolated pattern in which the defect was detected was defined as the resolution limit. The results are listed in Table 2.

Comparative Example 3

In order to evaluate the influence of removing of the resist film formed on the film made of the material containing chromium on the basis of the resolution limit of a fine pattern corresponding to an assist pattern of a line pattern, a photomask (halftone phase shift mask) was manufactured in the same manner as in Example 3 according to the processes illustrated in FIGS. 8 and 7 by using a photomask blank having the resist film obtained in Comparative Example 1, and the resolution limit of the fine pattern was evaluated. The evaluation results are listed in Table 2.

As listed in Table 2, the phase shift mask blank according to Comparative Example 1 is affected by sulfuric acid cleaning, and thus, the resolution limit of the line pattern is deteriorated, whereas the phase shift mask blank according to Example 1 as the photomask blank according to the present invention is not affected by sulfuric acid cleaning, and thus, it was confirmed that the resolution limit that was superior to that of the phase shift mask blank according to Comparative Example 1 was maintained even after the cleaning with sulfuric acid. It is considered that this is because the first layer of the hard mask film of the photomask blank according to the present invention has such a composition that the first layer is hard to react with sulfuric acid, sulfate ions are hard to remain on the surface of the first layer, and even after the cleaning with sulfuric acid, good adhesion to the resist film can be maintained.

TABLE 1

|  |  | Chromium | Oxygen | Nitrogen | Thickness (nm) | Optical Density |
|---|---|---|---|---|---|---|
|  |  | Content (atomic %) |  |  |  |  |
| Example 1 | First layer | 37 | 55 | 8 | 25 | 2.4 |
|  | Second layer | 52 | 12 | 36 | 4 |  |
|  | Third layer | 37 | 55 | 8 | 21 |  |
| Comparative Example 1 | First layer | 42 | 46 | 12 | 10 | 2.4 |
|  | Second layer | 52 | 12 | 36 | 4 |  |
|  | Third layer | 37 | 55 | 8 | 37 |  |

TABLE 2

| Photomask blank | Resolution limit of isolated line pattern | | Difference of resolution limit |
| --- | --- | --- | --- |
| | Not cleaning with sulfuric acid/ hydrogen peroxide | Cleaning with sulfuric acid/ hydrogen peroxide | |
| Example 1 | 40 nm (Example 2) | 40 nm (Example 3) | 0 nm |
| Comparative Example 1 | 46 nm (Comparative Example 2) | 56 nm (Comparative Example 3) | 10 nm |

Japanese Patent Application No. 2018-104532 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A transmissive photomask blank comprising: a substrate;
   a film made of a material containing chromium; and a processing film which is formed to be in contact with a side of the film made of the material containing chromium close to the substrate and is processed by using a pattern of the film made of the material containing chromium as an etching mask,
   wherein the film made of the material containing chromium is a stacked film having a three-layer structure including a first layer, a second layer and a third layer from a side apart from the substrate, and each of the first layer, the second layer and the third layer contains chromium, oxygen and nitrogen,
   the first layer has a chromium content of 40 atomic % or less, an oxygen content of 50 atomic % or more, a nitrogen content of 10 atomic % or less, and a thickness of 20 nm or more,
   the second layer has a chromium content of 50 atomic % or more, an oxygen content of 20 atomic % or less, and a nitrogen content of 30 atomic % or more,
   the third layer has a chromium content of 40 atomic % or less, an oxygen content of 50 atomic % or more, and a nitrogen content of 10 atomic % or less, and
   the photomask blank is a transmissive photomask blank.

2. The transmissive photomask blank according to claim 1, wherein the second layer has a thickness of 5 nm or less, and the third layer has a thickness of 5 nm or more.

3. The transmissive photomask blank according to claim 1, wherein the processing film is a film made of a material containing silicon.

4. The transmissive photomask blank according to claim 3, wherein the film made of the material containing chromium is a light shielding film, the film made of the material containing the silicon is a phase shift film, the photomask blank is a phase shift mask blank, and an optical density of a combination of the light shielding film and the phase shift film is 3 or more with respect to exposure light.

5. The transmissive photomask blank according to claim 4, wherein the film made of the material containing chromium has a thickness of 40 nm or more and 65 nm or less.

6. The transmissive photomask blank according to claim 4, wherein the phase shift film has a phase shift of 175 degrees or more and 185 degrees or less and a transmittance of 6% or more and 30% or less, with respect to the exposure light, and a thickness of 50 nm or more and 90 nm or less.

7. A method of manufacturing a transmissive photomask having a circuit pattern of the film made of the material containing silicon from the transmissive photomask blank according to claim 3, comprising steps of:
   (A) forming a resist film in contact with a side of the film made of the material containing chromium apart from the substrate;
   (C) patterning the resist film to form a resist pattern;
   (D) patterning the film made of the material containing chromium by dry etching using a chlorine-based gas containing oxygen by using the resist pattern as an etching mask to form a pattern of the film made of the material containing chromium;
   (E) patterning the film made of the material containing silicon by dry etching using a fluorine-based gas by using the pattern of the film made of the material containing chromium as an etching mask to form a pattern of the film made of the material containing silicon; and
   (F) after the step (E), allowing the film made of the material containing chromium to remain in a portion located on an outer peripheral portion of the substrate which is a region where a circuit pattern of the film made of the material containing the silicon is not formed and removing a pattern of the film made of the material containing chromium other than the outer peripheral portion by dry etching using a chlorine-based gas containing oxygen.

8. The method according to claim 7, further comprising, between the steps (A) and (C), a step of (B) removing the resist film by using a mixed solution of sulfuric acid and hydrogen peroxide water to newly form a resist film to be brought into contact with a side of the film made of the material containing chromium apart from the substrate.

9. The transmissive photomask blank according to claim 1, further comprising a resist film which is in contact with a side of the film made of the material containing chromium apart from the substrate and has a thickness of 50 nm or more and 200 nm or less.

10. A transmissive photomask having a circuit pattern of a film made of a material containing silicon on a substrate,
    wherein a film made of a material containing chromium is formed to be in contact with the film made of the material containing the silicon in a portion located on an outer peripheral portion of the substrate which is a region where a circuit pattern of the film made of the material containing the silicon is not formed,
    the film made of the material containing chromium is a stacked film having a three-layer structure including a first layer, a second layer, and a third layer from a side apart from the substrate, and each of the first layer, the second layer and the third layer contains chromium, oxygen and nitrogen,
    the first layer has a chromium content of 40 atomic % or less, an oxygen content of 50 atomic % or more, a nitrogen content of 10 atomic % or less, and a thickness of 20 nm or more,
    the second layer has a chromium content of 50 atomic % or more, an oxygen content of 20 atomic % or less, and a nitrogen content of 30 atomic % or more,
    the third layer has a chromium content of 40 atomic % or less, an oxygen content of 50 atomic % or more, and a nitrogen content of 10 atomic % or less, and the photomask is a transmissive photomask.

11. The transmissive photomask according to claim 10, wherein the second layer has a thickness of 5 nm or less, and the third layer has a thickness of 5 nm or more.

12. The transmissive photomask according to claim 10, wherein the film made of the material containing chromium is a light shielding film, the film made of the material containing the silicon is a phase shift film, the photomask is a phase shift mask, and an optical density of a combination of the light shielding film and the phase shift film is 3 or more, with respect to exposure light.

13. The transmissive photomask according to claim 12, wherein the film made of the material containing chromium has a thickness of 40 nm or more and 65 nm or less.

14. The transmissive photomask according to claim 12, wherein the phase shift film has a phase shift of 175 degrees or more and 185 degrees or less and a transmittance of 6% or more and 30% or less, with respect to the exposure light, and a thickness of 50 nm or more and 90 nm or less.

* * * * *